US008665032B2

(12) United States Patent
Tanaya et al.

(10) Patent No.: US 8,665,032 B2
(45) Date of Patent: Mar. 4, 2014

(54) FLEXURAL MODE RESONATOR ELEMENT, RESONATING DEVICE, AND ELECTRONIC APPARATUS

(71) Applicant: Seiko Epson Corporation, Tokyo (JP)

(72) Inventors: Hideo Tanaya, Suwa (JP); Yoshiyuki Yamada, Minowa-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 13/623,433

(22) Filed: Sep. 20, 2012

(65) Prior Publication Data

US 2013/0026886 A1    Jan. 31, 2013

Related U.S. Application Data

(63) Continuation of application No. 12/967,485, filed on Dec. 14, 2010, now Pat. No. 8,299,863.

(30) Foreign Application Priority Data

Dec. 25, 2009 (JP) ................................ 2009-296144
Sep. 16, 2010 (JP) ................................ 2010-207591

(51) Int. Cl.
*H03B 5/32* (2006.01)
*H01L 41/04* (2006.01)
*H03H 9/21* (2006.01)

(52) U.S. Cl.
USPC ............ 331/156; 310/348; 310/370; 333/200

(58) Field of Classification Search
USPC .............. 310/348, 366, 367, 370; 331/107 A, 331/154, 156; 333/200
See application file for complete search history.

(56) References Cited

U.S. PATENT DOCUMENTS

| 6,587,009 | B2 | 7/2003 | Kitamura et al. | |
|---|---|---|---|---|
| 7,015,631 | B2 | 3/2006 | Hirasawa et al. | |
| 7,067,966 | B2 * | 6/2006 | Tanaya ......................... | 310/367 |
| 7,071,794 | B2 | 7/2006 | Kawashima | |
| 7,521,846 | B2 | 4/2009 | Tanaya | |
| 7,550,905 | B2 | 6/2009 | Tanaya | |
| 7,592,741 | B2 | 9/2009 | Tanaya et al. | |
| 7,675,224 | B2 | 3/2010 | Tanaya | |
| 7,714,484 | B2 * | 5/2010 | Hara et al. .................... | 310/348 |
| 7,859,172 | B2 * | 12/2010 | Ishikawa et al. .............. | 310/348 |
| 7,936,115 | B2 * | 5/2011 | Kikushima ................... | 310/370 |

(Continued)

FOREIGN PATENT DOCUMENTS

| JP | A-2002-261575 | 9/2002 |
|---|---|---|
| JP | A-2004-297198 | 10/2004 |
| JP | A-2006-148857 | 6/2006 |

*Primary Examiner* — Levi Gannon
(74) *Attorney, Agent, or Firm* — Oliff PLC

(57) ABSTRACT

A flexural mode resonator element includes: a vibration arm extending from a base end toward a tip; a base joined to the vibration arm at the base end; and supporting arms arranged on both sides of the base in a width direction perpendicular to an extending direction of the vibration arm and joined to the base, wherein the base has a reduced cross-section portion disposed along the extending direction of the vibration arm between a joint portion with the vibration arm and a joint portion with the supporting arms, and the reduced cross-section portion is disposed so as to satisfy a relationship $2 \times W1 \leq L \leq 6 \times W1$ where L is the length of the reduced cross-section portion in the extending direction of the vibration arm, and W1 is the arm width of the vibration arm.

9 Claims, 7 Drawing Sheets

(56) References Cited

U.S. PATENT DOCUMENTS

| | | |
|---|---|---|
| 7,982,374 B2 | 7/2011 | Yoshimatsu et al. |
| 8,446,079 B2 * | 5/2013 | Fang et al. .................... 310/370 |
| 2008/0106172 A1 * | 5/2008 | Tanaya et al. ................ 310/344 |
| 2010/0079036 A1 * | 4/2010 | Iwai .............................. 310/348 |

* cited by examiner

FLEXURAL MODE RESONATOR ELEMENT, RESONATING DEVICE, AND ELECTRONIC APPARATUS

This is a Continuation of application Ser. No. 12/967,485 filed Dec. 14, 2010, which in turn claims priority under 35 USC 119 from Japanese Patent Application No. 2009-296144, filed Dec. 25, 2009 and Japanese Patent Application No. 2010-207591, filed Sep. 16, 2010, the disclosures of which are both incorporated by reference herein, in their entirety.

BACKGROUND

1. Technical Field

The present invention relates to a flexural mode resonator element, and further to a resonating device such as a resonator or an oscillator having a flexural mode resonator element housed in a package.

2. Related Art

For communication apparatuses such as mobile phones, information apparatuses such as personal computers, and other various electronic apparatuses, various types of resonating devices, such as resonators or oscillators, using a piezoelectric material or a non-piezoelectric material have been widely used. Especially for recent resonating devices, with the increased performance and reduced size of electronic apparatuses, a further reduction in size, highly accurate performance and high stability with the CI (Crystal Impedance) value being decreased are required.

For suppressing the CI value while reducing the size, a tuning-fork type resonator element which vibrates in a flexural mode generally adopts a structure in which a groove in a longitudinal direction is formed in front and back main surfaces of a vibration arm and an excitation electrode on the main surface side is formed on an inner surface of the groove. For eliminating variation in CI values between resonator elements while achieving size reduction by shortening a base in the tuning-fork type resonator element having such a structure, a technique has been known in which cutout portions are formed in both side portions of the base to prevent vibration leakage from the vibration arm to the base side (refer to JP-A-2002-261575, for example).

This tuning-fork type resonator element is bonded at the base on a mounting surface with a conductive adhesive or the like and supported thereon in a cantilever manner. Therefore, since an area for coating the adhesive is needed for the base, there is a limit to reduce the size. Moreover, since the distance from the vibration arm to the bonding position of the base is short, even when the cutout portions are disposed at the sides of the base, it may be impossible to sufficiently prevent the vibration leakage from the vibration arm.

A structure has been known in which a tuning-fork type resonator element is not fixedly bonded at a base, but supporting arms extending from the base parallel to vibration arms are disposed in a frame shape, and the tuning-fork type resonator element is fixedly supported at the supporting arms (refer to JP-A-2004-297198, for example). This tuning-fork type resonator element can achieve size reduction by reducing the dimension of the base in a longitudinal direction and can suppress vibration leakage by increasing the distance from the vibration arm to the fixed position of the supporting arm.

Also in the tuning-fork type resonator element which is fixedly supported at the supporting arms extending from the base parallel to the vibration arms as described above, it is proposed to dispose cutout portions at positions of the base nearer the vibration arms than the supporting arms (refer to JP-A-2006-148857, for example). With the cutout portions, an increase in CI value caused by the occurrence of vibration leakage from the vibration arm to the supporting arm via the base is prevented.

In the tuning-fork type resonator element disclosed in JP-A-2006-148857, each depth of the cutout portions is preferably set by reducing the width so that each bottom coincides with outer side edges of the vibration arms respectively adjacent to the cutout portions, for suppressing the vibration leakage. Further according to JP-A-2006-148857, the cutout portion is preferably formed from an end of the base to which the vibration arm is joined to a position exceeding the length corresponding to the arm width of the vibration arm. However, JP-A-2006-148857 does not refer to the effect that the length of the cutout portion has on the prevention of the vibration leakage, that is, on the reduction in CI value.

A flexural mode resonator element can be formed of a material having etching anisotropy, such as a quartz substrate. In this case, when a quartz substrate is wet etched to fabricate the outer shape of the resonator element, a protrusion, called a fin, is left on a side surface of the fabricated portion due to the orientation of a quartz crystal face because of the effect of anisotropic etching. Especially a tuning-fork type resonator element is more reduced in size and complicated in shape, and therefore, a fin having an unfavorable shape is generated at, for example, a coupling part of a supporting arm and a base, which may cause stress concentration to result in unstable vibration or may cause damage due to impact.

SUMMARY

Advantages of some aspects of the invention are to solve at least a part of the problems in the related art. One advantage of some aspects of the invention is to, in a flexural mode resonator element which is fixedly supported by supporting arms extending from a base to which a vibration arm is joined, improve the structure of the base, prevent vibration leakage from the vibration arm to the supporting arm via the base, and reduce the CI value for improving vibration characteristics.

Another advantage of some aspects of the invention is to, in the flexural mode resonator element having such a supporting structure, achieve improvement in impact resistance while decreasing the CI value by preventing the vibration leakage and achieving size reduction.

Still another advantage of some aspects of the invention is to provide, by including a flexural mode resonator element from which at least a part of the problems in the related has been eliminated, a resonating device such as a resonator or an oscillator, a sensor apparatus, and an electronic apparatus, which provide excellent vibration characteristics due to a reduction in CI value and excellent impact resistance.

In a flexural mode resonator element having a structure in which the flexural mode resonator element is fixedly supported by supporting arms extending from a base to which a vibration arm is joined and when a reduced cross-section portion whose cross-section is reduced in size is disposed by forming in the base the above-described cutout portions or the like along an extending direction of the vibration arm between a joint portion with the vibration arm and a joint portion with the supporting arms, the present inventors investigated the effect of the size, especially, length of the reduced cross-section portion on a reduction in CI value of the piezoelectric resonator element. As a result, it was found that by setting a length L of the reduced cross-section portion in the extending direction of the vibration arm to satisfy the relationship $2 \times W1 \leq L$, it is possible to effectively suppress the occurrence of vibration leakage from the vibration arm to the supporting arm via the base, and to stably decrease the CI value. It was further found, based on the relation between the length of the vibration arm and the length of the base, that the upper limit of the length L is preferably set to the relationship L≤6×W1. The flexural mode resonator element according to some aspects of the invention has been made based on such findings.

A flexural mode resonator element according to an aspect of the invention includes: a base; a vibration arm extending from one of ends of the base; and supporting arms joined to an end of the base on the opposite side and arranged on both sides thereof. The base has a reduced cross-section portion provided with notches at both side portions thereof between a joint portion with the supporting arms and the one end. The reduced cross-section portion is disposed so as to satisfy the relationship 2×W1≤L≤6×W1 where L is the length of the reduced cross-section portion in a longitudinal direction of the vibration arm, and W1 is the arm width of the vibration arm.

By disposing in the base the reduced cross-section portion having the predetermined length L in the extending direction of the vibration arm, it is possible to effectively prevent the vibration leakage from the vibration arm to the supporting arm via the base, stably decrease the CI value, and realize an improvement in vibration characteristics.

In an embodiment, the reduced cross-section portion of the base can be easily disposed, without adding another fabricating step, by forming the notches along both side portions of the base between the joint portion with the vibration arm and the joint portion with the supporting arms simultaneously when fabricating the outer shape of the resonator element, for example.

In another embodiment, the vibration arm includes a pair of vibration arms extending from the base in parallel, and the reduced cross-section portion is disposed such that a width W3 thereof satisfies the relationship W3<W2 where W2 is the width between outer side edges of the pair of vibration arms, whereby the occurrence of vibration leakage from the vibration arm through the base to the supporting arm side can be effectively suppressed.

In still another embodiment, the supporting arms have supporting arm portions extending in the extending direction of the vibration arm on both sides of the vibration arm in the width direction, and coupling portions extending from the base in the width direction to be joined to the supporting arm portions. The supporting arm portion and the coupling portion are connected with a rounded corner interposed therebetween, so that the strength of the connection portion can be increased to improve impact resistance against dropping or the like. Further, even when the outer shape of the flexural mode resonator element is fabricated from a quartz Z plate by wet etching, a protrusion, called a fin, formed between the supporting arm and the base because of the difference in etching rate due to the orientation of a quartz crystal face has a shape which is relatively gentle and unlikely to cause stress concentration, which is advantageous.

According to another aspect of the invention, by including the flexural mode resonator element according to the aspect of the invention and a package housing the flexural mode resonator element, the vibration leakage can be reduced to decrease the CI value, and therefore, a resonating device excellent in vibration characteristics and impact resistance is provided.

In a resonating device according to one embodiment, the supporting arms of the flexural mode resonator element have supporting arm portions extending in the extending direction of the vibration arm on both sides of the vibration arms in the width direction, and coupling portions extending from the end of the base on the opposite side from the vibration arm in the width direction to be joined to the supporting arm portions. The supporting arm portion and the coupling portion are connected with a rounded corner interposed therebetween, and the flexural mode resonator element is fixedly supported on a mounting surface of the package at portions of the supporting arm portions on the vibration arm side. Thus, since the flexural mode resonator element is supported at positions nearer the center in the longitudinal direction, a substantial portion of the impact on the flexural mode resonator element is absorbed by the deformation of the coupling portion of the supporting arm and the base side. Accordingly, the resonating device according to the aspect of the invention reduces the deformation of the flexural mode resonator element on the vibration arm tip side, can prevent damage or the like caused by the contact with an inner surface of the package, and provides excellent impact resistance against dropping or the like.

According to still another aspect of the invention, by including the flexural mode resonator element according to the aspect of the invention and a circuit device having an oscillator circuit oscillating the flexural mode resonator element, the vibration leakage can be reduced to decrease the CI value, and therefore, a resonating device functioning as an oscillator excellent in vibration characteristics and impact resistance is provided.

According to yet still another aspect of the invention, by including the flexural mode resonator element according to the aspect of the invention and a circuit device having an oscillator circuit oscillating the flexural mode resonator element, the vibration leakage can be reduced to decrease the CI value, and therefore, various electronic apparatuses excellent in vibration characteristics and impact resistance are provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
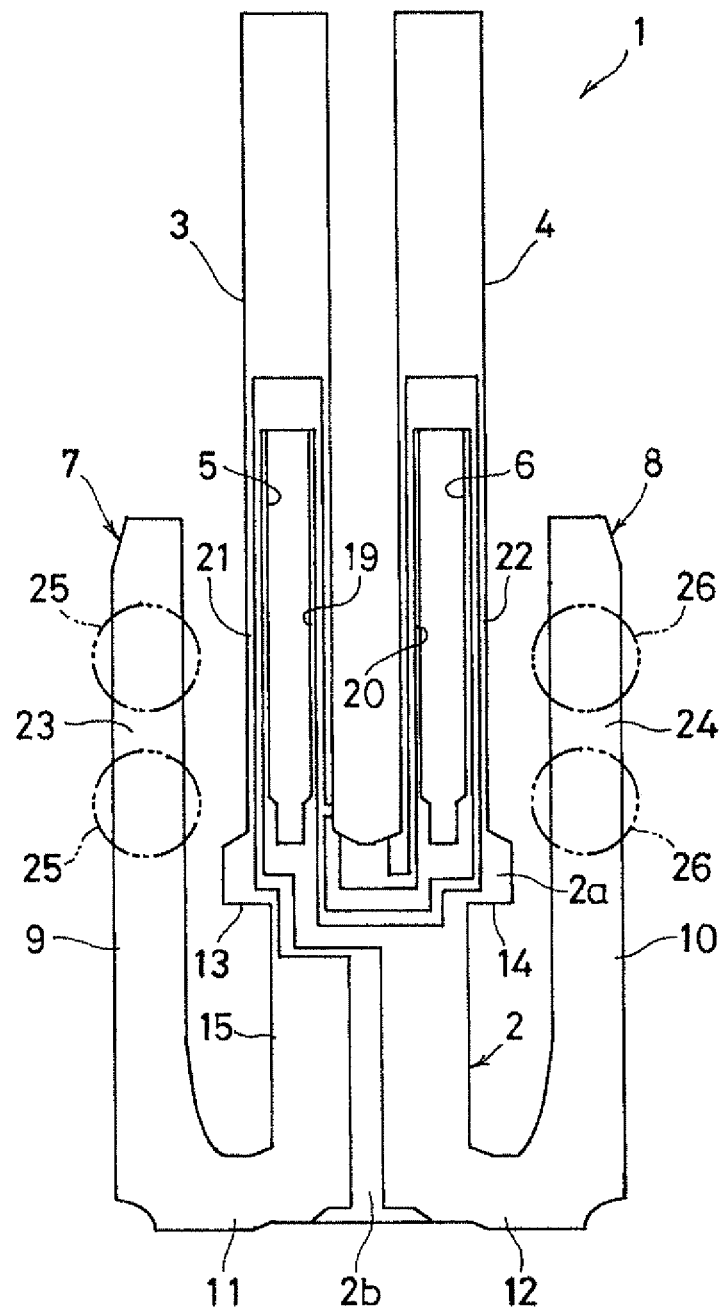
FIG. 1 is a plan view of a tuning-fork type resonator element according to an embodiment of the invention.

Hereinafter, preferred embodiments of the invention will be described in detail with reference to the accompanying drawings. In the accompanying drawings, the same or similar constituents are denoted by the same or similar reference numerals and signs.

FIG. 1 shows a preferred embodiment of a tuning-fork type resonator element to which the invention is applied. The tuning-fork type resonator element 1 of the embodiment is formed using a piezoelectric material and includes a base 2 and a pair of vibration arms 3 and 4. The vibration arms 3 and 4 extend in parallel to each other from base ends toward tips and are joined to one end 2a of the base 2 at the base ends. In front and back main surfaces of the vibration arms 3 and 4, grooves 5 and 6 extending in a longitudinal direction, that is, in an extending direction of the vibration arm are respectively formed.

The tuning-fork type resonator element 1 further includes a pair of supporting arms 7 and 8 arranged on both sides of the base 2 in a width direction perpendicular to the extending direction of the vibration arm and joined to the base. The supporting arms 7 and 8 respectively have supporting arm portions 9 and 10 extending in the extending direction of the vibration arm outside the vibration arms 3 and 4, and coupling portions 11 and 12 joining the supporting arm portions with the base 2. The coupling portions 11 and 12 extend from the vicinity of an end 2b of the base 2 on the opposite side from the vibration arms to both sides of the base in the width direction, and are joined to the respective corresponding supporting arm portions.

Figure 2:
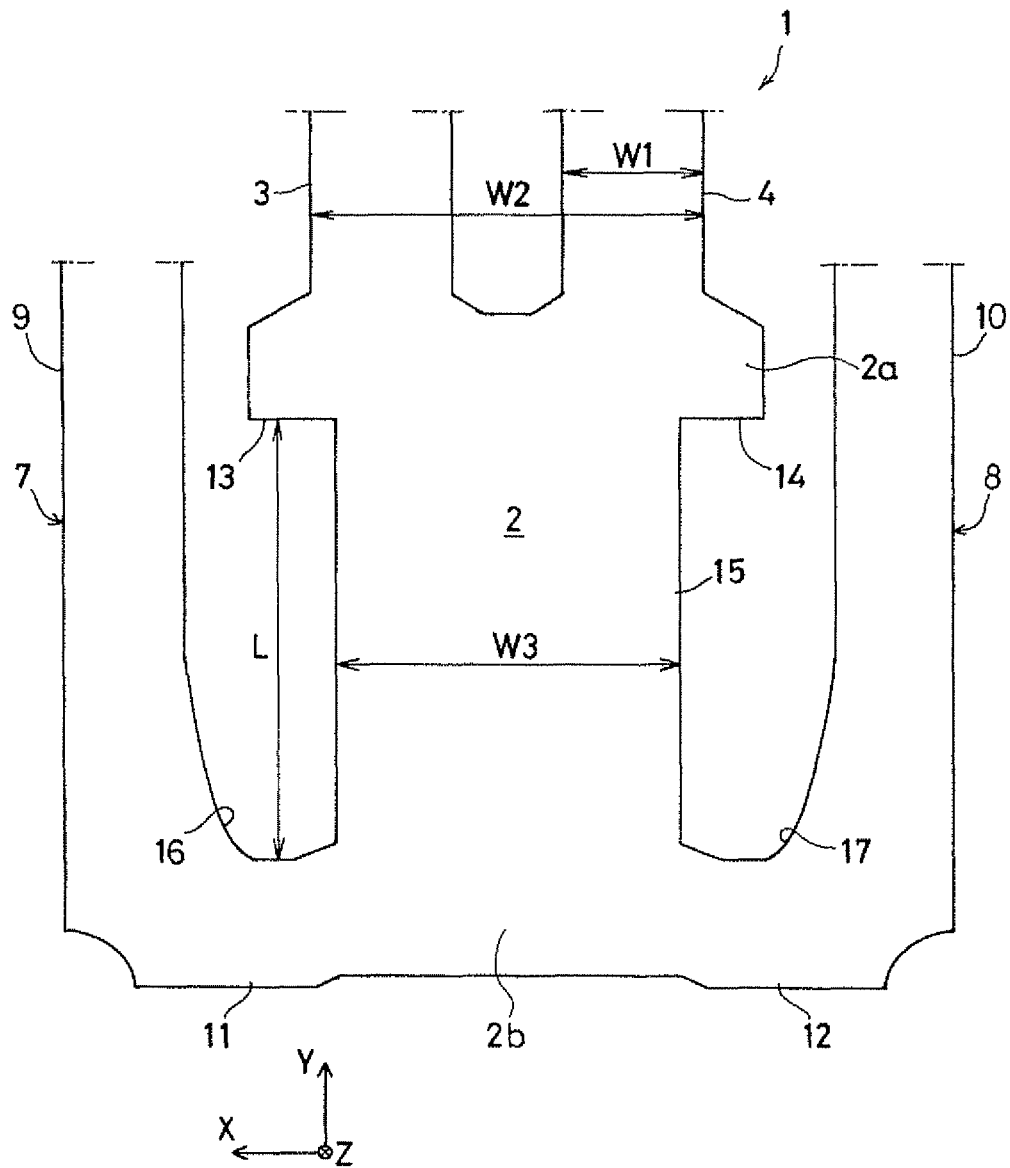
FIG. 2 is a partially enlarged view showing a main portion of the tuning-fork type resonator element in FIG. 1.

Notches 13 and 14 are symmetrically formed respectively at both side portions of the base 2. As shown in FIG. 2, the notches 13 and 14 are disposed from positions somewhat below the end 2a to which the vibration arms are joined, to positions at which the coupling portions 11 and 12 of the supporting arms are joined. With these notches, a reduced cross-section portion 15 whose cross-section is reduced in size is disposed in the base 2 along the extending direction of the vibration arm between the end 2a as a joint portion with the vibration arms and the end 2b as a joint portion with the supporting arms.

The reduced cross-section portion 15 is disposed such that a length L thereof in the longitudinal direction, that is, in the extending direction of the vibration arm, relative to an arm width W1 of the vibration arm, satisfies the relationship $2 \times W1 \leq L \leq 6 \times W1$. Moreover, a width W3 of the reduced cross-section portion 15 is set, relative to a width W2 between outer side edges of the vibration arms 3 and 4, so as to satisfy the relationship $W3<W2$. By disposing the reduced cross-section portion 15 in this manner, it is possible to effectively suppress the occurrence of vibration leakage from the vibration arm to the supporting arm side via the base 2.

The supporting arms 7 and 8 respectively have rounded corners 16 and 17 connecting the supporting arm portions 9 and 10 with the coupling portions 11 and 12. A joint part between the supporting arm portion and the coupling portion is likely to suffer from stress concentration when the tuning-fork type resonator element 1 is supported at the supporting arm portions. The corners 16 and 17 are rounded such that from the supporting arm portions 9 and 10 toward the coupling portions 11 and 12, their inner side edges do not bend at a right or sharp angle, but its width progressively increases, whereby the strength of the joint part is increased. Thus, the tuning-fork type resonator element 1 can be improved in impact resistance so that the tuning-fork type resonator element 1 is not easily broken or damaged even with impact such as dropping.

As described above, the tuning-fork type resonator element 1 of the embodiment can be formed in a desired outer shape with a piezoelectric material, such as quartz, lithium tantalate, or lithium niobate, using a known photo-etching technique. Especially when forming the tuning-fork type resonator element 1 with quartz, it is common to use a quartz Z plate cut by being rotated within a range of 0° to 5° clockwise about the Z-axis (optic axis) of the quartz crystal axis, and to orient the Y-axis (mechanical axis) in the longitudinal direction of the vibration arm.

Figures 3A, 3B:
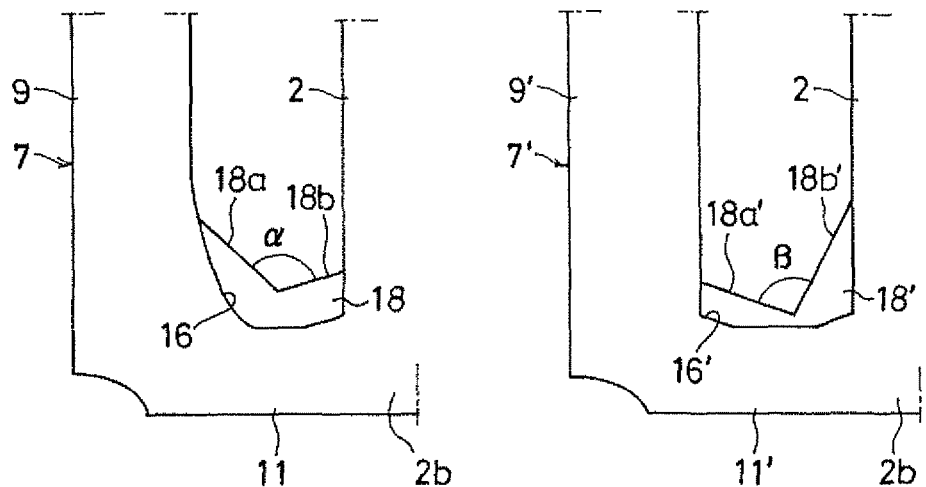
FIGS. 3A and 3B are partially enlarged views showing coupling portions of supporting arms in the embodiment and in a related art, respectively.

When the tuning-fork type resonator element 1 is fabricated from the quartz Z plate by wet etching, even if an exposure mask for photolithography is prepared to be adapted to the desired outer shape of the piezoelectric resonator element, a protrusion, called a fin, is left at edges of the tuning-fork type resonator element 1 because of the difference in etching rate due to the orientation of a quartz crystal face, failing to obtain the desired outer shape in some cases. FIG. 3A shows a fin 18 formed between the supporting arm 7 having the rounded corner 16 and the base 2. The fin 18 has two sides 18a and 18b intersecting each other at a relatively shallow obtuse angle α in different directions corresponding to the orientation of the quartz crystal face.

FIG. 3B shows a case where a supporting arm portion 9' and a coupling portion 11' of a supporting arm 7' are connected to each other at a substantially right angle via a non-rounded corner 16'. In this case, a fin 18' formed between the supporting arm 7' and the base 2 has two sides 18a' and 18b' intersecting each other at an angle β which is nearly 90°. In the case of FIG. 3B, therefore, stress concentration is likely to occur at a portion of the fin 18' where the two sides 18a' and 18b' intersect each other, which may cause damage due to impact such as dropping. Whereas, in the embodiment, stress concentration is unlikely to occur at a portion of the fin 18 where the two sides 18a and 18b intersect each other, which provides excellent impact resistance.

As shown in FIG. 1, first excitation electrodes 19 and 20 are respectively formed on inner surfaces of the grooves 5 and 6 in the front and back main surfaces of the vibration arms 3 and 4, and second excitation electrodes 21 and 22 are respectively formed on side surfaces of the vibration arms. The first excitation electrode 19 and the second excitation electrode 21 of one of the vibration arms are respectively connected to the second excitation electrode 22 and the first excitation electrode 20 of the other vibration arm by cross wiring. Extraction electrodes 23 and 24 are respectively formed on front surfaces of the supporting arms 7 and 8. The extraction electrode 23 is connected to the first excitation electrode 20 and the second excitation electrode 21, and the extraction electrode 24 is connected to the first excitation electrode 19 and the second excitation electrode 22, via wiring on the base 2.

The tuning-fork type resonator element 1 is fixedly supported at portions of the supporting arm portions 9 and 10 nearer the tips thereof, that is, on the vibration arm side, on a mounting surface of a package or the like using conductive adhesives 25 and 26, for example. When a predetermined current is applied from the outside to the tuning-fork type resonator element 1 via the extraction electrodes 23 and 24, the vibration arms 3 and 4 perform flexural vibration toward each other and away from each other at a predetermined frequency. In the embodiment, the reduced cross-section portion 15 having the above-described size is disposed between the end 2a and the end 2b of the base 2, so that it is possible to effectively suppress the occurrence of vibration leakage from the vibration arms which perform flexural vibration to the supporting arm 7 side and the supporting arm 8 side via the base 2.

Figure 4:
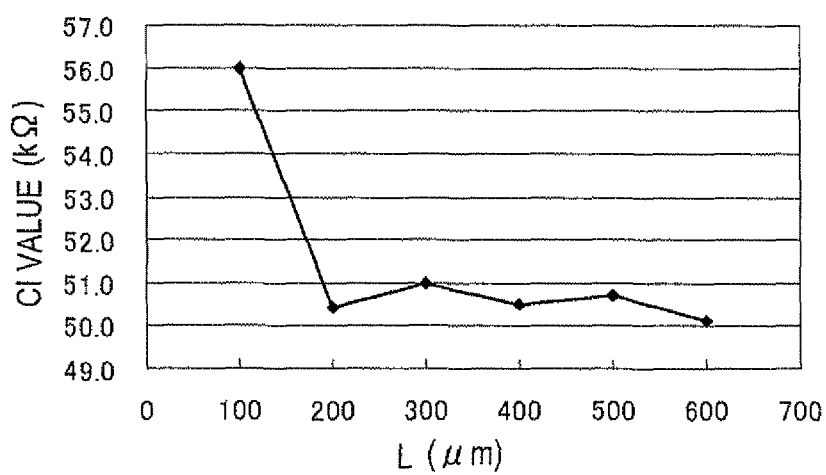
FIG. 4 is a diagram showing the relation between the CI value and length L of a reduced cross-section portion of the tuning-fork type resonator element in FIG. 1.

For the tuning-fork type resonator element 1 in FIG. 1, an evaluation experiment of the CI value was conducted while changing the length L of the reduced cross-section portion 15. In this case, the total length of the tuning-fork type resonator element 1 is 2300 µm; the arm width W1 of the vibration arms 3 and 4 is 100 µm; the arm length of the vibration arms is 1600 µm; the width of the base 2 is 250 µm; the length of the base is 700 µm; the width of the coupling portions 11 and 12 of the supporting arms is 140 µm; and the length L of the reduced cross-section portion is changed from 100 µm to 600 µm at 100 µm intervals. FIG. 4 shows the results of the evaluation experiment.

As can be seen from the drawing, the CI value of the tuning-fork type resonator element 1 drops abruptly at the length L=200 µm and is substantially constant stably thereafter. In the embodiment in this manner, the CI value can be reduced when the length L of the reduced cross-section portion 15 is within the range L≥200 µm relative to the arm width W1=100 µm. According to the embodiment of the invention, therefore, it could be confirmed that the vibration leakage from the base 2 to the supporting arms 7 and 8 can be effectively prevented by disposing the reduced cross-section portion 15 so as to satisfy the relationship 2×W1≤L.

If the length L of the reduced cross-section portion 15 is set too long, the total length of the tuning-fork type resonator element 1 is increased, which is contrary to size reduction. Further, the coupling portions 11 and 12 are likely to suffer from stress concentration upon drop impact, which may cause damage. Therefore, the upper limit of the length L is preferably set to the relationship L≤600 µm=6×W1. Across both side portions of the base 2, a portion wider than the reduced cross-section portion 15 and having at least a length of about 100 µm can be left on the end 2a side nearer than the positions of the notches 13 and 14. It is considered that the wide portion effectively acts for preventing the vibration leakage.

In the embodiment as shown in FIG. 2, the wide portion left on the end 2a side of the base 2 is disposed so as to extend in the width direction beyond the outer side edges of the vibration arms 3 and 4. In another embodiment, the wide portion can be disposed such that both sides thereof coincide with the outer side edges of the vibration arms 3 and 4 to have the same width as the width W2 between the outer side edges of the vibration arms. In either case, the width W3 of the reduced cross-section portion 15 is set narrower than the width W2 between the outer side edges of the vibration arms 3 and 4, whereby the vibration leakage from the base 2 to the supporting arm side can be effectively suppressed.

In still another embodiment, the tuning-fork type resonator element 1 can be formed using a non-piezoelectric material. For example, the invention can also be applied similarly to a resonator having a structure in which a tuning-fork type resonator element is formed of a non-piezoelectric material such as silicon, and a piezoelectric thin film such as of zinc oxide (ZnO) or aluminum nitride (AlN) is formed on a surface of the resonator element as a driving portion for vibrating the resonator element.

Figure 5A:
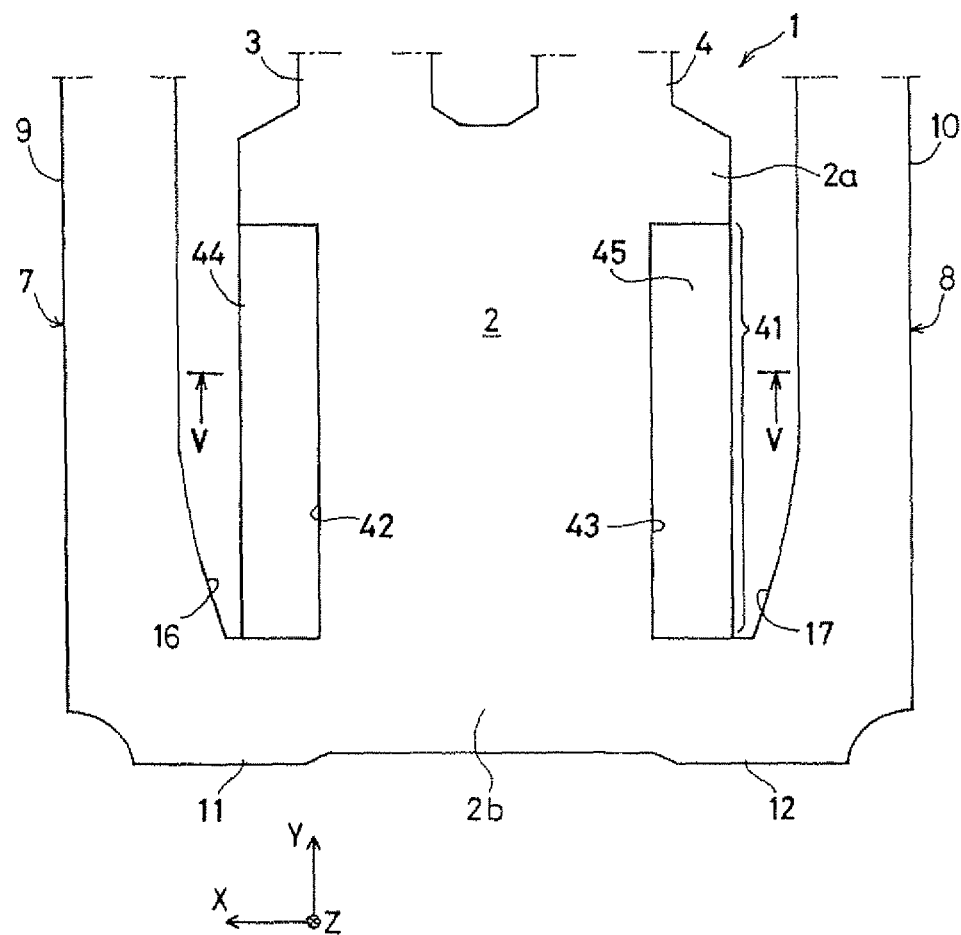
FIG. 5A is a partially enlarged view showing a main portion of a tuning-fork type resonator element according to a modified example.
Figure 5B:
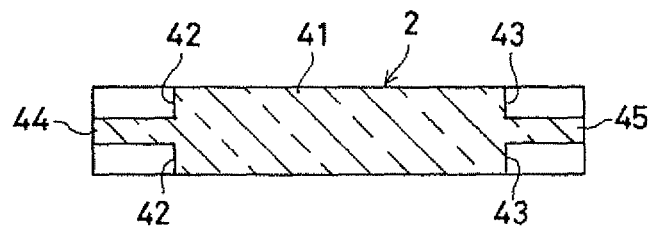
FIG. 5B is a cross-sectional view along line V-V in FIG. 5A.

The reduced cross-section portion of the base 2 can be disposed in various forms other than the notches 13 and 14 in FIG. 1. In a modified example shown in FIGS. 5A and 5B, a reduced cross-section portion 41 is disposed by recessing grooves 42 and 43 in the front and back surfaces to form thin portions 44 and 45 along both side portions of the base 2 between the end 2a as the joint portion with the vibration arms 3 and 4 and the end 2b as the joint portion with the supporting arm portions 9 and 10. The grooves can be fabricated by wet etching, for example. In the modified example, the grooves 42 and 43 are formed at the same positions in a planner manner and in the same dimensions as those of the notches 13 and 14 in FIG. 1. In another example, the grooves can be formed in dimensions or a shape different from that of the modified example.

Figure 6A:
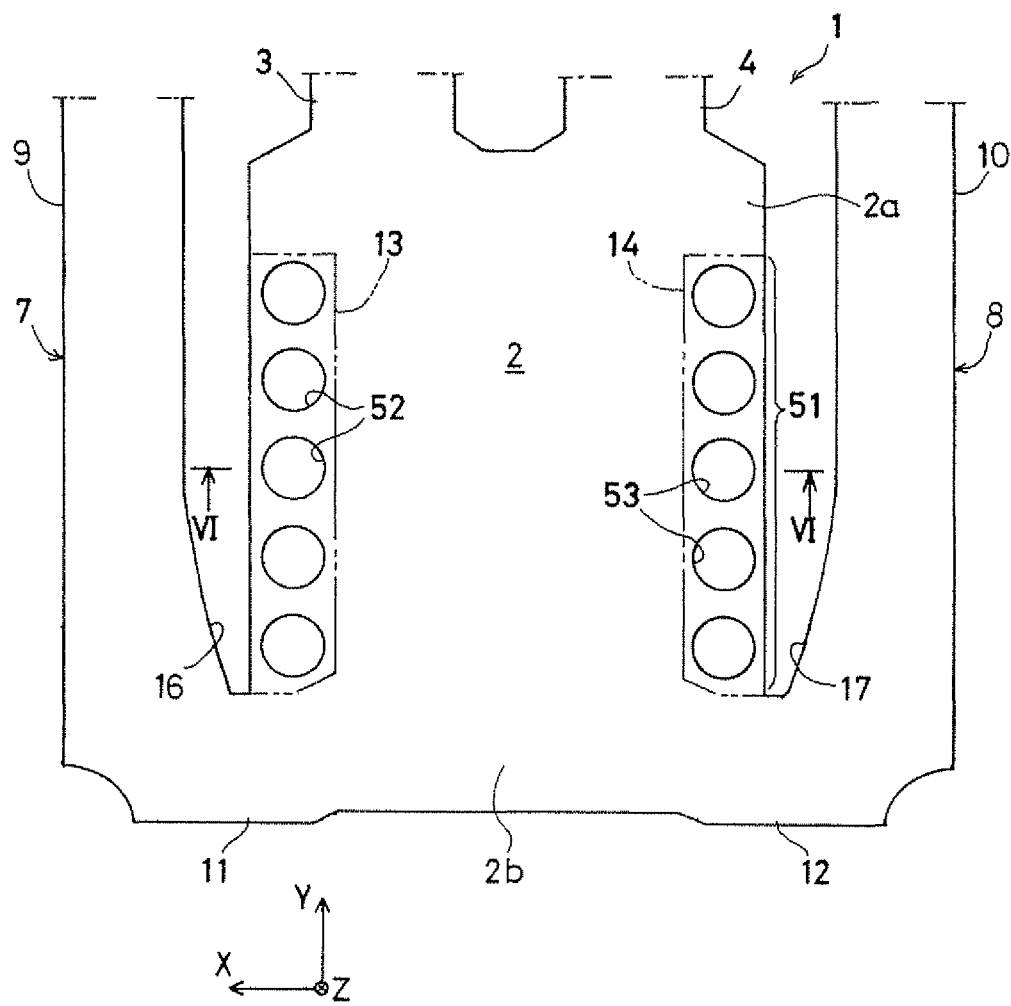
FIG. 6A is a partially enlarged view showing a main portion of a tuning-fork type resonator element according to another modified example.
Figure 6B:
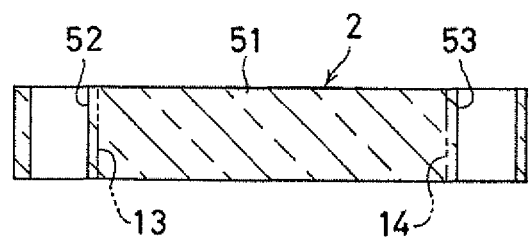
FIG. 6B is a cross-sectional view along line VI-VI in FIG. 6A.

In another modified example shown in FIGS. 6A and 6B, a reduced cross-section portion 51 is disposed by continuously forming a number of circular through holes 52 and 53 at substantially constant intervals along both side portions of the base 2 between the end 2a and the end 2b. The through holes can be fabricated by, for example, wet etching, dry etching such as ion beam etching, or laser irradiation. The through holes 52 and 53 of the modified example are formed to be respectively positioned in regions corresponding to the notches 13 and 14 in FIG. 1, indicated by imaginary lines in FIGS. 6A and 6B. In another example, these through holes can be disposed so as to extend from the regions of the notches 13 and 14 in the width direction, or the through holes next to each other in a planner manner can be disposed so as to partially overlap each other. Moreover, the reduced cross-section portion can be formed with a number of bottomed holes instead of the through holes.

Figure 7A:
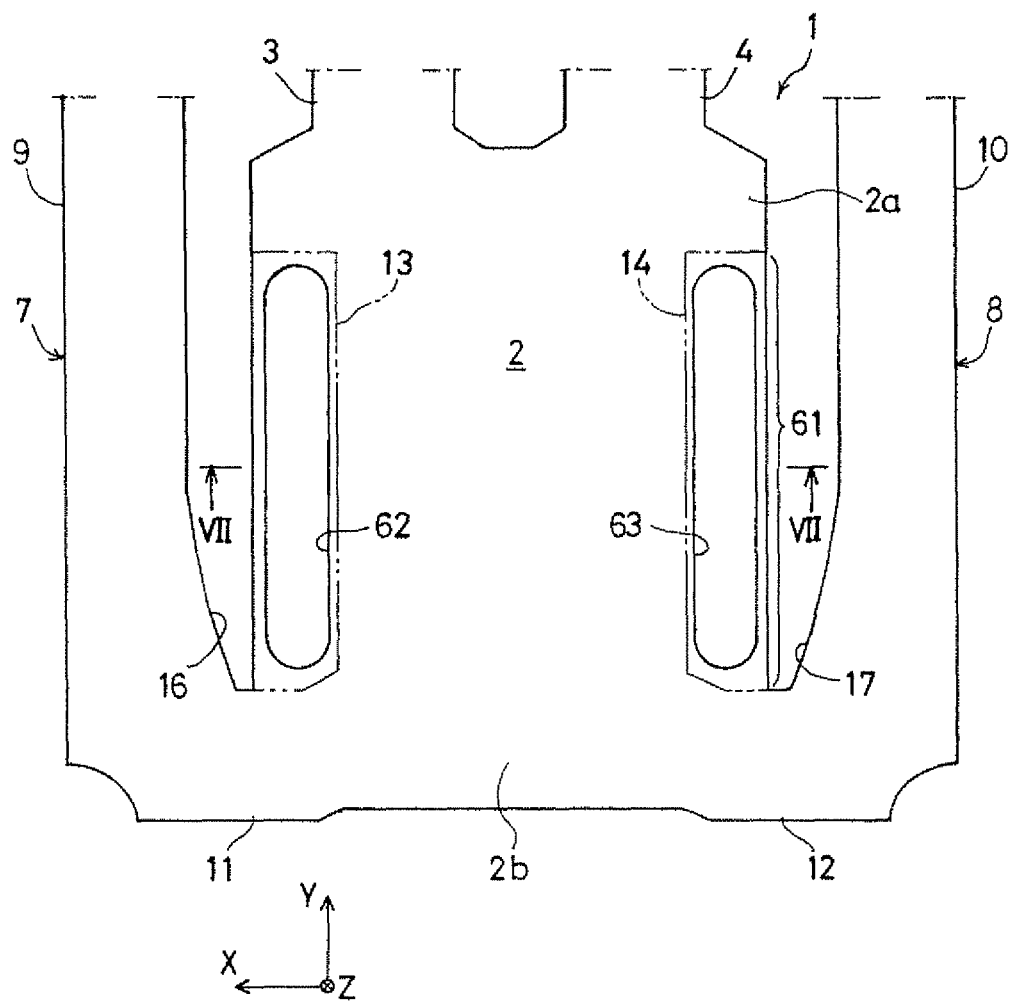
FIG. 7A is a partially enlarged view showing a main portion of a tuning-fork type resonator element according to still another modified example.
Figure 7B:
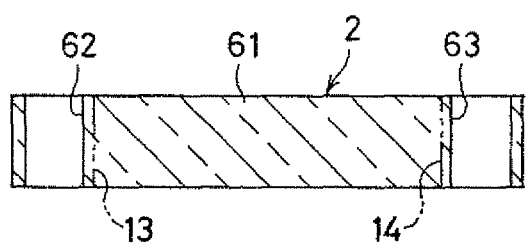
FIG. 7B is a cross-sectional view along line VII-VII in FIG. 7A.

In still another modified example shown in FIGS. 7A and 7B, a reduced cross-section portion 61 is disposed with through grooves 62 and 63 extending along both side portions of the base 2 between the end 2a and the end 2b. The through grooves can be fabricated by, for example, wet etching, or dry etching such as ion beam etching. The through grooves 62 and 63 of the modified example are formed to be respectively positioned in regions corresponding to the notches 13 and 14 in FIG. 1, indicated by imaginary lines in FIGS. 7A and 7B. In another example, these through holes can be disposed so as to extend from the regions of the notches 13 and 14 in the width direction.

In the above-described examples, the notches, grooves, through holes, or through grooves are symmetrically formed at both side portions of the base 2 for disposing the reduced cross-section portion. However, they may be asymmetrically formed as long as they reduce the cross-section of the base between the end 2a as the joint portion with the vibration arms and the end 2b as the joint portion with the supporting arms in the extending direction of the vibration arm.

Figure 8:
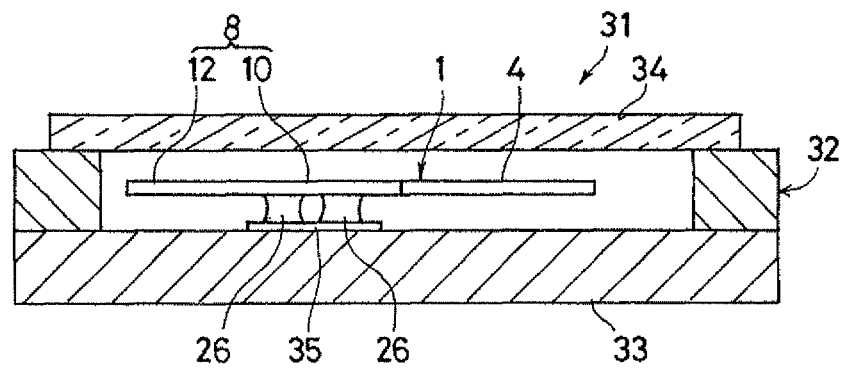
FIG. 8 is a longitudinal cross-sectional view of a resonator on which the tuning-fork type resonator element in FIG. 1 is mounted.

FIG. 8 shows an embodiment of a resonator on which the tuning-fork type resonator element 1 in FIG. 1 is mounted. The tuning-fork type resonator 31 of the embodiment includes a surface mount type package 32 for housing the tuning-fork type resonator element 1. The package 32 has a rectangular box-like base 33 having a stacked structure of, for example, ceramic thin plates, and a rectangular plate-like lid 34 formed of glass or the like.

The base 33 is provided with mount electrodes 35 on a bottom surface in a space defined in the inside thereof, at positions corresponding to the above-described portions of the tuning-fork type resonator element 1 nearer the tips of the supporting arm portions 9 and 10. By aligning each of the supporting arms with the corresponding mount electrode 35 and adhering them with the conductive adhesive 26, the tuning-fork type resonator element 1 is electrically connected and fixedly supported mechanically inside the base 33. When the lid 34 is airtightly bonded at an upper end of the base 33, the tuning-fork type resonator element is airtightly sealed in the package 32.

Figure 9:
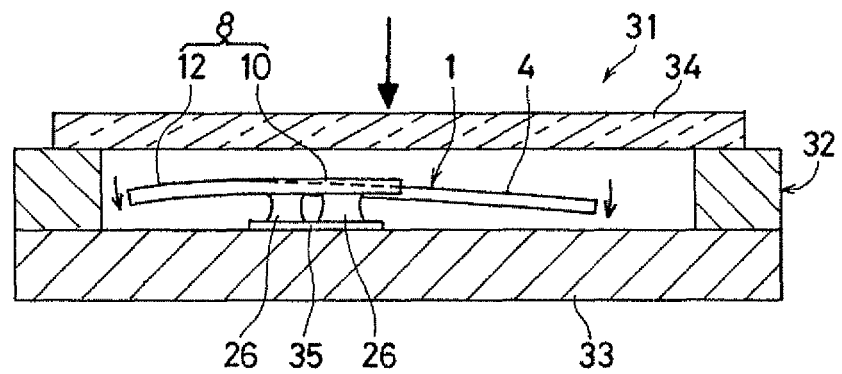
FIG. 9 is a longitudinal cross-sectional view, similar to FIG. 8, showing a deformed state of the tuning-fork type resonator element upon drop impact.

FIG. 9 shows deformation which occurred in the tuning-fork type resonator element 1 upon a downward impact on the tuning-fork type resonator 31. By fixing the supporting arm 8 (7) at the position nearer the tip, that is, not on the base 2 side but on the tip side of the vibration arm, the tuning-fork type resonator element 1 is supported at a position nearer the center in the longitudinal direction. Accordingly, the supporting arm 8 (7) of the tuning-fork type resonator element 1 is downwardly deflected at the coupling portion 12 (11) side with the fixed position due to the conductive adhesive 26 (25) as a fulcrum. At the same time, the vibration arm 4 (3) is downwardly deflected with the coupling portion and the base 2 side as a fulcrum. In this manner, since a substantial portion of the impact on the tuning-fork type resonator element 1 is absorbed by the deformation of the coupling portion and the base 2 side, it is possible to prevent the tip of the vibration arm 4 (3) from being greatly deflected to contact the inner surface of the package 32 to thereby cause damage or the like.

In the tuning-fork type resonator element 1, however, if the length L of the reduced cross-section portion 15 is set too long, the coupling portion 11 side and the coupling portion 12 side of the supporting arms and/or the vibration arms greatly deflect upon external impact, so that a larger stress may concentrate on the coupling portions. For preventing this, the length L of the reduced cross-section portion has to be appropriately selected. According to the embodiment of the invention as described above, the upper limit of the length L is preferably set to the relationship $L \leq 600\,\mu m = 6 \times W1$. With this setting, the tuning-fork type resonator 31 provides an excellent impact resistance against impact such as dropping.

The invention is not limited to the embodiments and modified examples, but various modifications or changes can be made within the technical range thereof. For example, the invention can also be applied similarly to other various flexural mode resonator elements each having a vibration arm extending from a base, such as a gyro device having a vibration arm extending from a base. The flexural mode resonator element of the invention can be mounted on packages having various structures other than that of the embodiment. For example, the flexural mode resonator element of the invention can be applied to various resonating devices other than a resonator, such as an oscillator combined with a circuit device having an oscillator circuit. Further the flexural mode resonator element of the invention can be widely used as a timing device, by combining with a circuit device having an oscillator circuit, for electronic apparatuses such as digital mobile phones, personal computers, electronic timepieces, video recorders, or television sets, and can contribute to improvement in the operating characteristics, and the like, of these electronic apparatuses.

What is claimed is:

1. A vibrator comprising:
   a vibration arm extending from a base end toward a tip;
   a base joined to the vibration arm at the base end; and
   supporting arms arranged on both sides of the base in a width direction perpendicular to an extending direction of the vibration arm and joined to the base, wherein
   the base has a reduced cross-section portion disposed along the extending direction of the vibration arm between a joint portion with the vibration arm and a joint portion with the supporting arms,
   the reduced cross-section portion having a reduced cross-section extending along both sides of the base, the reduced cross-section being less than a cross-section of a remaining portion of the base,
   wherein the reduced cross-section portion is disposed so as to satisfy a relationship $2 \times W1 \leq L \leq 6 \times W1$ where L is the length of the reduced cross-section portion in the extending direction of the vibration arm, and W1 is the arm width of the vibration arm,
   wherein the vibration arm includes a pair of vibration arms extending in parallel from the base, and
   the reduced cross-section portion is disposed so as to satisfy a relationship $W3 < W2$ where W2 is the width between outer side edges of the pair of vibration arms, and W3 is the width of the reduced cross-section portion.

2. The vibration piece of claim 1, wherein
   the supporting arms have supporting arm portions extending in the extending direction of the vibration arm on both sides of the vibration arm in the width direction, and
   coupling portions extending from the base in the width direction to be joined to the supporting arm portions,
   wherein the supporting arm portions and the coupling portion are connected with a rounded corner portion interposed therebetween.

3. A vibration device comprising:
   the vibrator of claim 1, and
   a package housing the vibrator.

4. The vibration device of claim 3, wherein
   the vibrator is fixedly supported on a mounting surface of the package at a portion on the vibration arm side of the supporting arm portions.

5. A vibration device comprising:
   the vibrator of claim 1, and a circuit element.

6. An electronic apparatus comprising:
   the vibrator of claim 1.

7. The vibrator of claim 1, wherein the reduced cross-section portion includes a thin portion having recessed front and rear surfaces along each side of the base between a first edge which is a connected portion with the vibration arm and a second edge which is a connected portion with the supporting arms.

8. The vibrator of claim 1, wherein the reduced cross-section portion includes a plurality of consecutive through-holes that extends along each side of the base between the first edge which is the connected portion with the vibration arm and the second edge which is the connected portion with the supporting arms.

9. The vibrator of claim 1, wherein the reduced cross-section portion includes a through-groove that extends along each side of the base between the first edge which is the connected portion with the vibration arm and the second edge which is the connected portion with the supporting arm.

* * * * *